United States Patent
Lin et al.

(10) Patent No.: US 11,532,562 B2
(45) Date of Patent: Dec. 20, 2022

(54) ROUTING STRUCTURE AND METHOD OF FORMING THE SAME

(71) Applicant: TAIWAN SEMICONDUCTOR MANUFACTURING COMPANY LTD., Hsinchu (TW)

(72) Inventors: Chin-Shen Lin, Taipei (TW); Wan-Yu Lo, Taoyuan County (TW); Meng-Xiang Lee, Yunlin County (TW); Hao-Tien Kan, Hsinchu (TW); Kuo-Nan Yang, Hsinchu (TW); Chung-Hsing Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 219 days.

(21) Appl. No.: 16/911,343

(22) Filed: Jun. 24, 2020

(65) Prior Publication Data

US 2021/0407913 A1 Dec. 30, 2021

(51) Int. Cl.
*H01L 23/538* (2006.01)
*H05K 1/02* (2006.01)

(52) U.S. Cl.
CPC ....... *H01L 23/5386* (2013.01); *H05K 1/0298* (2013.01)

(58) Field of Classification Search
CPC .............. H01L 23/5386; H05K 1/0298; H05K 2201/09227; H05K 1/025
See application file for complete search history.

(56) References Cited

U.S. PATENT DOCUMENTS 7,372,131 B2 * 5/2008 Corisis ................ H01L 23/5385
257/668
8,872,338 B2 * 10/2014 Young ............... H01L 23/49838
257/E39.007

* cited by examiner

*Primary Examiner* — Jasmine J Clark
(74) *Attorney, Agent, or Firm* — WPAT; Anthony King

(57) ABSTRACT

The present disclosure provides a routing structure. The routing structure includes a substrate having a first circuit region and a boundary surrounding the first circuit region. The routing structure also includes a first conductive trace coupled to a first conductive pad disposed in the first circuit region. The first conductive trace is inclined with respect to the boundary of the substrate. A method of forming a routing structure is also disclosed.

20 Claims, 9 Drawing Sheets

ROUTING STRUCTURE AND METHOD OF FORMING THE SAME

BACKGROUND

A routing structure may include a plurality of substrate layers, and the substrate layers may have one or more conductive traces disposed thereon and running between terminals of electronic components coupled to the routing structure.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION

Figure 1:
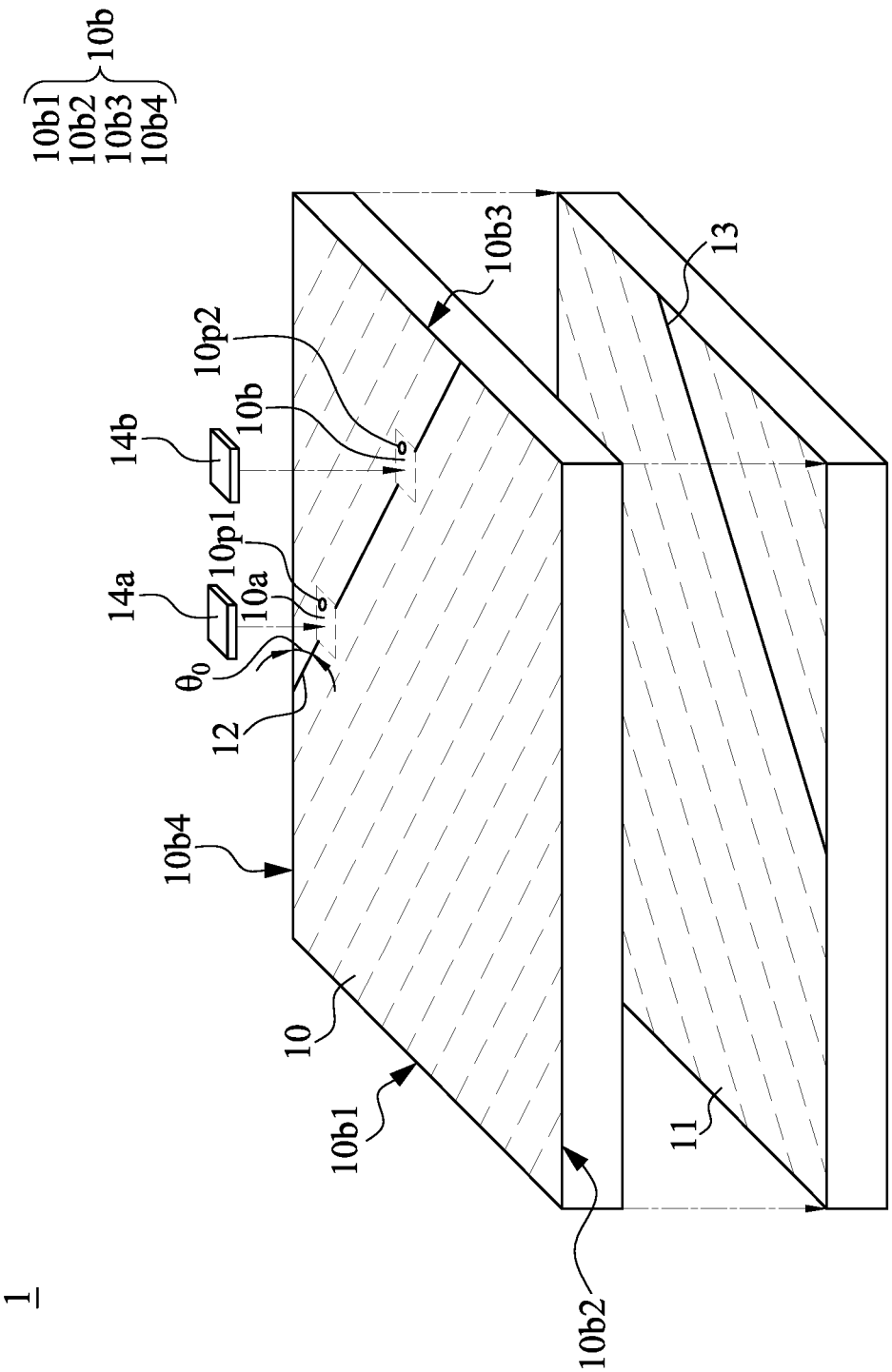
FIG. 1 illustrates an exploded perspective view of a routing structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments, or examples, illustrated in the drawings are disclosed below using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following descriptions should be understood to represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, FIG. 1 illustrates an exploded perspective view of a routing structure 1 in accordance with some embodiments of the present disclosure.

The routing structure 1 includes substrate layers (abbreviated to "substrate" in the other portions of the present disclosure) 10 and 11, conductive traces 12 and 13, and electronic components 14a and 14b.

In some embodiments, the routing structure 1 may be included in or applicable to a printed circuit board (PCB), an integrated circuit (IC), a field-programmable gate array (FPGA), a combination thereof, or other semiconductor device packages.

For the purpose of simplicity and clarity, an interconnection structure (such as a redistribution layer (RDL), a through via), a grounding element, and/or a power element may be omitted in FIG. 1. For example, the routing structure 1 may further include an interconnection structure, a grounding element and/or a power element.

In some embodiments, the routing structure 1 may be a hierarchical routing structure, and the substrate 10 and the substrate 11 may be bonded or stacked together as indicated by the dotted arrows. In some embodiments, the number of the substrate in the routing structure 1 can be adjusted according to design requirements and is not limited to the specific examples in the disclosure. For example, the routing structure 1 may include N layers of the substrates, and N may be an integer greater than 0.

In some embodiments, the substrate 10 may be the topmost layer in the routing structure 1. In some embodiments, the substrate 10 may have an active surface configured to receive the electronic components 14a and 14b. The electronic components 14a and 14b may be received on the active surface (not labelled in the figures) of the substrate 10.

In some embodiments, the routing structure 1 may only include the topmost layer (i.e., the substrate 10). For example, the other layer (i.e., the substrate 11) may be omitted in the routing structure 1.

In some embodiments, each of the substrate 10 and the substrate 11 may be (or may include), for example, a printed circuit board substrate, such as a paper-based copper clad laminate, a composite copper clad laminate, or a polymer-impregnated glass-fiber-based copper clad laminate. In some embodiments, each of the substrate 1 and the substrate 2 may include a silicon substrate, a silicon-germanium substrate, or another semiconductor substrate. Other substances, such as glass, multi-layered or gradient substrates may also be used.

The substrate 10 includes sides 10b1, 10b2, 10b3, and 10b4. The side 10b1 is connected between the side 10b2 and the side 10b4. The side 10b2 is connected between the side 10b1 and the side 10b3. The side 10b3 is connected between the side 10b2 and the side 10b4. The side 10b4 is connected between the side 10b1 and the side 10b3.

The side 10b1 is adjacent to the side 10b2 and the side 10b4. The side 10b2 is adjacent to the side 10b1 and the side 10b3. The side 10b3 is adjacent to the side 10b2 and the side 10b4. The side 10b4 is adjacent to the side 10b1 and the side 10b3.

In some embodiments, the sides 10b1, 10b2, 10b3, and 10b4 may be the outermost sides of the substrate 10. For example, sides 10b1, 10b2, 10b3, and 10b4 may together form a boundary (or a border, or an edge) of the substrate 10. The sides 10b1, 10b2, 10b3, and 10b4 may be collectively referred to as a boundary 10b in the other portions of the present disclosure. In other embodiments, the substrate 10 as shown in FIG. 1 is a portion of an entire substrate, and the sides 10b1, 10b2, 10b3, and 10b4 define the boundary 10b of a portion of the entire substrate.

Two adjacent sides may define a corner (not labeled in the figures) of the substrate 10. For example, there are four corners defined by the sides 10b1, 10b2, 10b3, and 10b4 of the substrate 10. In some embodiments, the boundary 10b of the substrate 10 may be a rectangle, and thus, each of the corners may have a right angle. In other words, two of the adjacent sides (such as the side 10b1 and the side 10b2) may be orthogonal (or perpendicular) to each other.

As can be seen from FIG. 1, several tracks and two circuit regions 10a and 10b depicted in dotted lines are on the active surface of the substrate 10.

In some embodiments, the tracks may be routes (or paths) defined (or set, or predetermined) to run conductive traces (such as the conductive trace 12). In some embodiments, the circuit regions 10a and 10b may be regions (or locations) defined (or set, or predetermined) to receive electronic components (such as the electronic components 14a and 14b). For example, the electronic components 14a and 14b may be connected to or bonded to the circuit regions 10a and 10b, respectively, of the substrate 10.

For example, one or more of the tracks may run over conductive pads 10p1 and 10p2 in proximity to, adjacent to, or embedded in and exposed at the active surface of the substrate 10. For example, the conductive trace 12 may be disposed on a track run over the conductive pads 10p1 and 10p2, and may be coupled to electrically connected to) the conductive pads 10p1 and 10p2.

The tracks are depicted in dotted lines since the conductive traces may not be formed thereon in the illustrated example of FIG. 1. In some embodiments, the tracks depicted in dotted lines may not be visible in the final product.

In some embodiments, the conductive trace 12 is inclined (or oblique, or slanted) with respect to the boundary 10b of the substrate 10. For example, the conductive trace 12 may have a sloping direction (or angle, or position) with respect to the boundary 10b of the substrate 10. For example, the conductive trace 12 may be non-perpendicular to the boundary 10b of the substrate 10. For example, the conductive trace 12 may be non-parallel to the boundary 10b of the substrate 10. For example, the conductive trace 12 and the boundary 10b of the substrate 10 (e.g., the side 10b4) may define an acute angle (annotated as "$\theta_0$").

The substrate 11 may have a similar structure or layout as the substrate 10. For example, the substrate 11 may include four sides, which together form a boundary (or a border, or an edge) of the substrate 11.

Similar to substrate 10, several tracks depicted in dotted lines are defined on the substrate 11. The substrate 11 may have a wiring layout different from the substrate 10. For example, the tracks on the substrate 11 may be nonparallel to the tracks on the substrate 10. For example, the tracks on the substrate 11 may be not aligned with the tracks on the substrate 10. For example, the tracks on the substrate 11 and the tracks on the substrate 10 may be not overlapped from a top view. For example, the tracks on the substrate 11 and the boundary of the substrate 11 may define an acute angle, which may be different from the angle $\theta_0$.

The conductive trace 13 on the substrate 11 may run over conductive pads (not illustrated in FIG. 1) in proximity to, adjacent to, or embedded in and exposed at a surface of the substrate 11. The conductive trace 13 on the substrate 11 may couple to the conductive trace 12 on the substrate 10 through a through via (not illustrated in FIG. 1).

In some embodiments, the electronic components 14a and 14b may be bonded on the substrate 10 and coupled to the substrate 10 through the conductive pads 10p1 and 10p2, respectively. In some embodiments, the electronic components 14a and 14b may be coupled to each other through the conductive trace 12. Although the sides of the electronic components 14a and 14b illustrated in FIG. 1 are aligned with the boundary 10b of the substrate 10, the electronic components 14a and 14b may face toward any other direction. For example, the sides of the electronic components 14a and 14b may be aligned with the conductive trace 12.

The electronic components 14a and 14b disposed on the active surface of the substrate 10 may be spaced apart from each other in an oblique direction with respect to the boundary 10b of the substrate 10. For example, the minimum clear spacing distance between the electronic components 14a and 14b may be non-parallel (or non-perpendicular) to the boundary 10b of the substrate 10. For example, the minimum clear spacing distance between the electronic components 14a and 14b may be inclined with respect to the boundary 10b of the substrate 10.

With the inclined tracks according to the present disclosure, the minimum clear spacing distance between the electronic components 14a and 14b (and also the conductive pads 10p1 and 10p2) may be overlapped with (or aligned with, or in line with) the inclined tracks. In other words, the conductive trace 12 may be the shortest routing distance between the electronic components 14a and 14b (and also the conductive pads 10p1 and 10p2).

In some embodiments, each of the electronic components 14a and 14b may be a chip or a die including therein a semiconductor substrate, one or more integrated circuit devices and one or more overlying interconnection structures. The integrated circuit devices may include active devices such as transistors and/or passive devices such resistors, capacitors, inductors, or a combination thereof.

In some comparative approaches, unlike the inclined tracks as shown in FIG. 1 of the present disclosure, orthogonal tracks (such as tracks parallel or perpendicular to the boundary of the substrate) may be defined to route the conductive traces running between the terminals of the electronic components. Consequently, the conductive traces can only run in the orthogonal directions parallel (or perpendicular) to the boundary of the substrate. As a result, if the electronic components are spaced apart from each other in an oblique direction, the distance of the conductive traces running between terminals of the electronic components may not be reduced, and routing congestion may occur.

In accordance with the embodiments as shown in FIG. 1, the tracks may be inclined (or oblique, or slanted) with respect to the boundary of the substrate. Therefore, the routing direction of the tracks may be defined more flexibly, and the conductive traces with a different sloping direction (or angle, or position) may be formed as desired.

As a result, with the inclined tracks, the minimum distance of conductive traces running between terminals of electronic components can be achieved. In addition, since the lines of conductive material can be shorter, the parasitic capacitance may be reduced, and the signal transmission may be facilitated.

In some embodiments, various operations can be performed to form tracks and conductive traces inclined with respect to the boundary of the substrate.

For example, a layout process of a routing structure usually includes the following operations: specifying where to place all electronic components in a substrate layer (i.e., specifying a wiring area); identifying how the connection between every electronic components will be routed (i.e., creating one or more tracks for conductive traces); arranging a power line and/or a ground line, if any; placing the electronic components in the wiring area; synthesizing a clock tree, if any; and creating conductive traces on the one or more of the tracks accordingly.

The track creation operations will be described below with respect to FIG. 2A, FIG. 2B, FIG. 2C, FIG. 2D, and FIG. 2E.

FIG. 2A, FIG. 2B, FIG. 2C, FIG. 2D, and FIG. 2E are top views of a part of a routing structure 1 in accordance with some embodiments of the present disclosure.

Figure 2A:
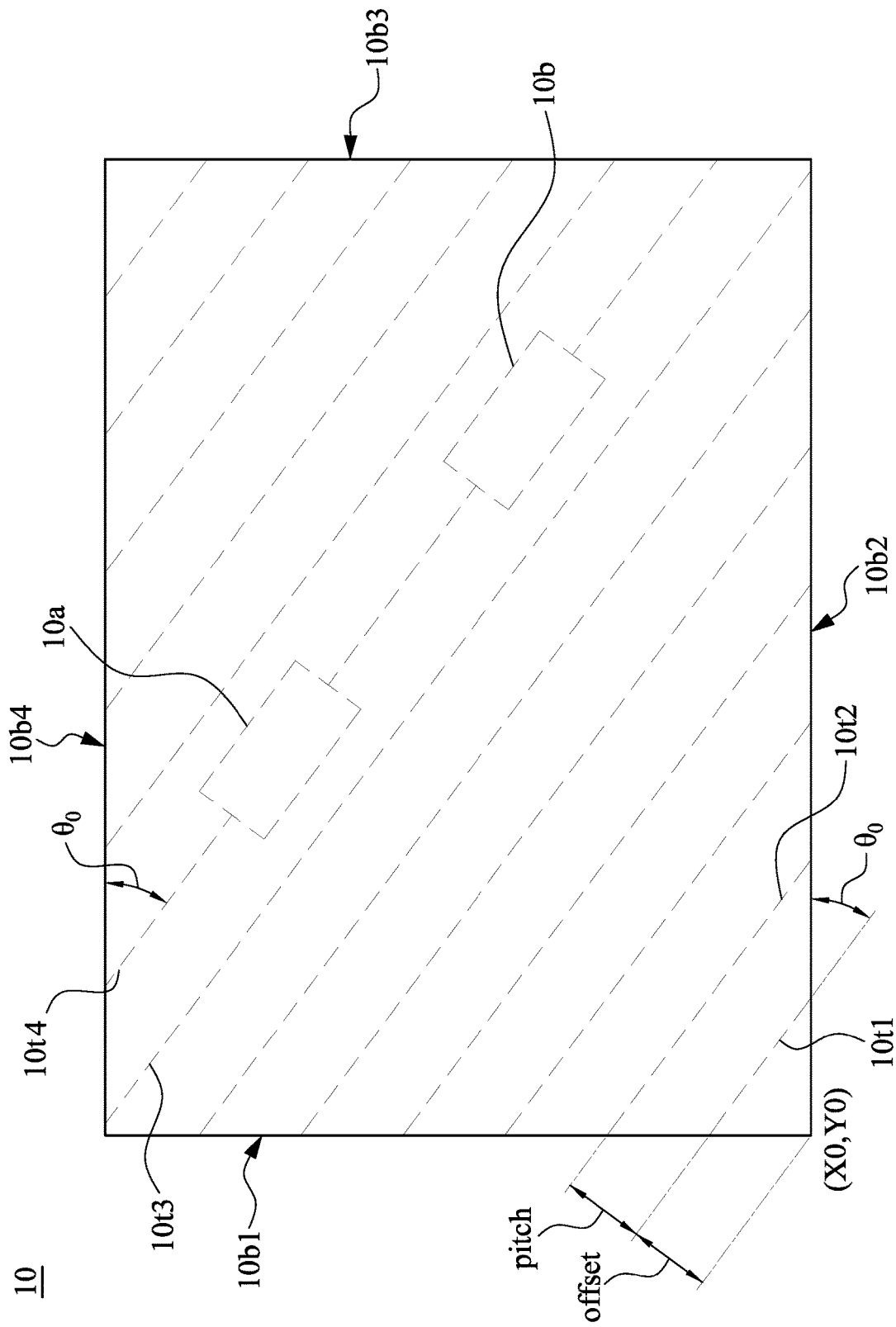
FIGS. 2A through 2E illustrate top views of a part of a routing structure in accordance with some embodiments of the present disclosure.

Referring to FIG. 2A, the entire active surface of the substrate 10 is defined as the wiring area. For example, in the illustrated example in FIG. 1, the wiring area encompasses the entire active surface of the substrate 10 such that the sides of the wiring area overlap with the sides 10b1, 10b2, 10b3, and 10b4 of the substrate 10. For example, the sides 10b1, 10b2, 10b3, and 10b4 (i.e., the outmost boundary of the substrate 10) are the outmost boundary of the wiring area.

In the embodiments wherein the entire active surface of the substrate is defined as the wiring area, the track and the conductive trace may intersect with the outmost boundary of the substrate. For example, the conductive trace 12 as shown in FIG. 1 intersects with two adjacent sides 10b3 and 10b4 of the substrate 10. For example, the tracks in FIG. 2A intersect with the sides 10b1, 10b2, 10b3, and 10b4.

Figure 4:
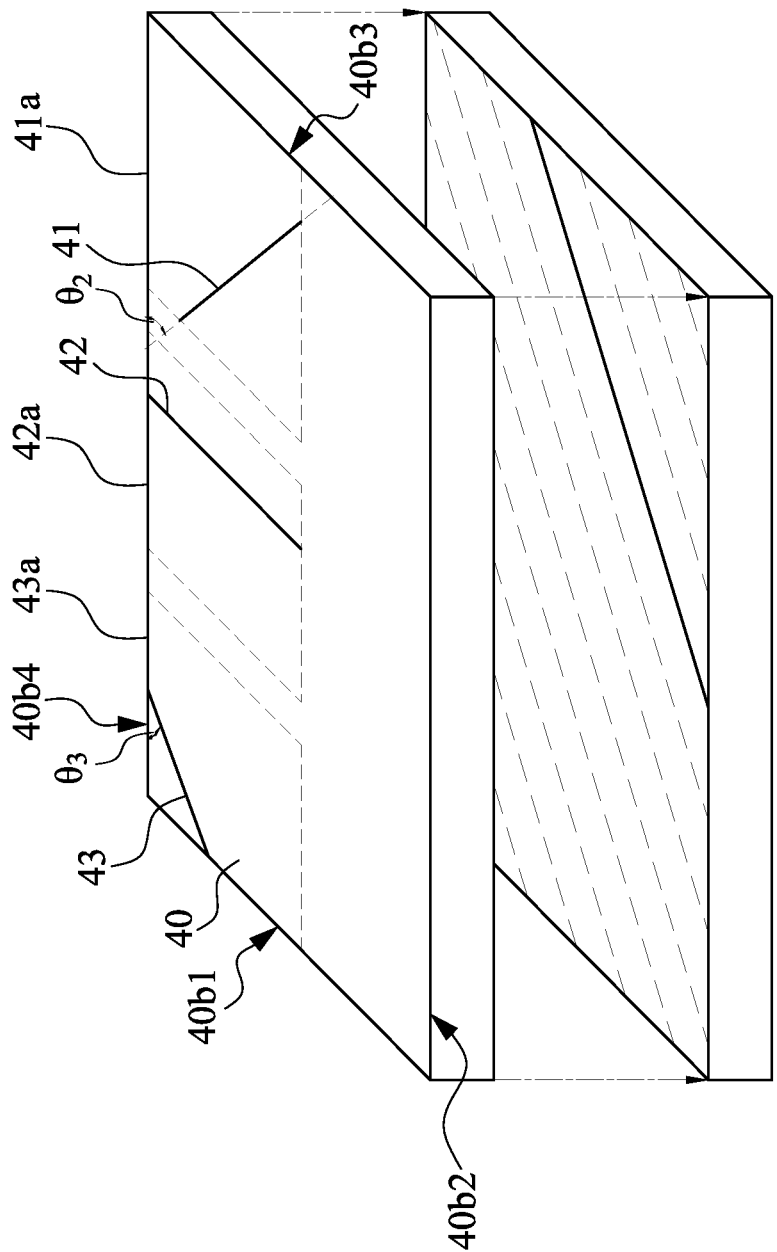
FIG. 4 illustrates an exploded perspective view of a routing structure in accordance with some embodiments of the present disclosure.

In some other embodiments, the wiring area may be inside of the outmost boundary or may be smaller than the active surface of the substrate (such as the wiring areas 41a, 42a, and 43a as illustrated in FIG. 4).

Subsequently, a reference point (or an origin of coordinates) is defined at a corner of the wiring area. In FIG. 2A, the reference point (which is annotated as $(X_0, Y_0)$) is defined at the corner between two adjacent sides 10b1 and 10b2 of the substrate 10.

Figure 2B:
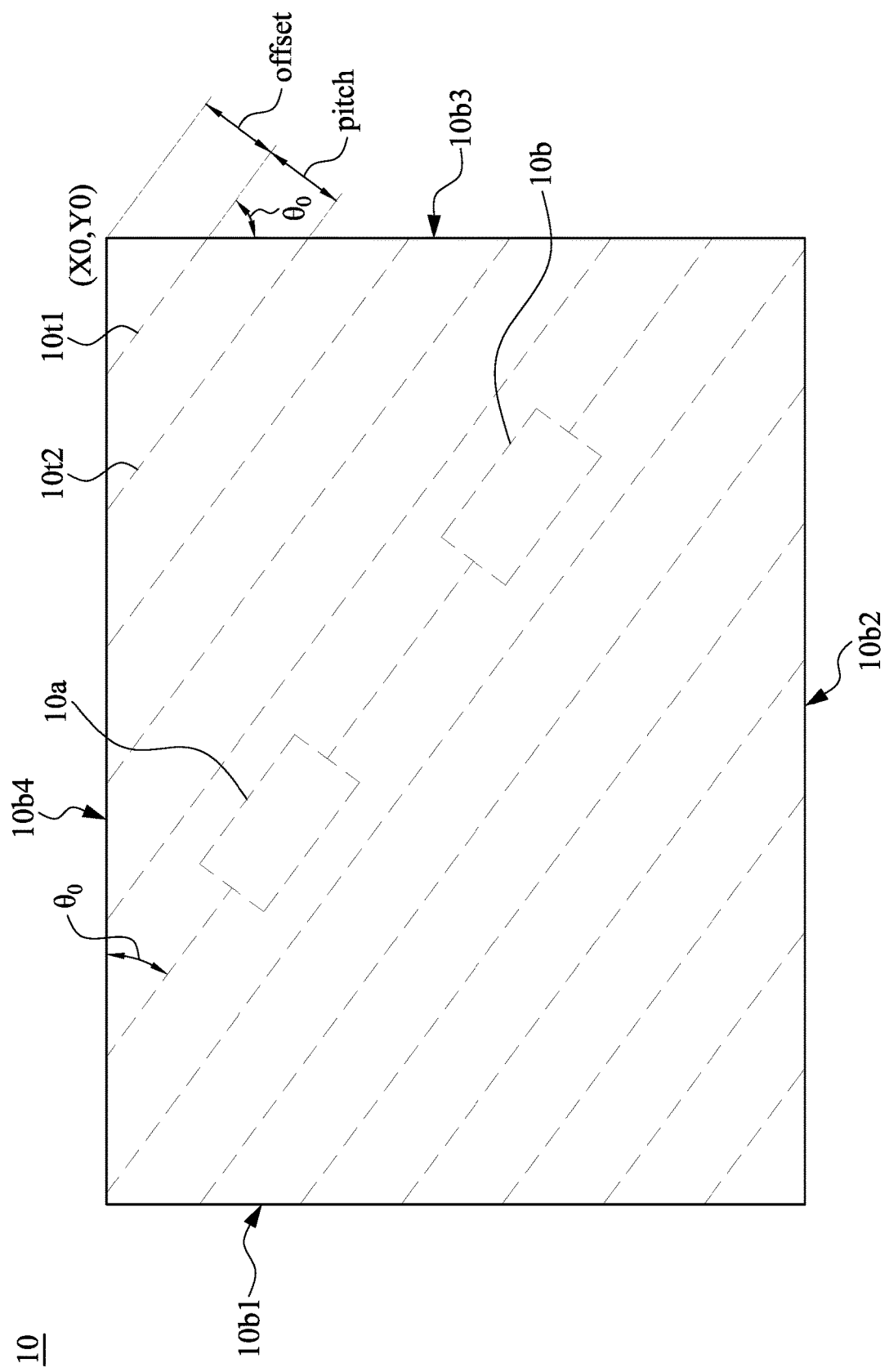

Since the tracks are set to be inclined in a direction from the left upper corner to the right lower corner, the reference point may be defined at the left lower corner as illustrated in FIG. 2A. In some embodiments, the reference point may be defined at the right upper corner as illustrated in FIG. 2B.

Next, a distance and an angle for setting the first track may be determined. In FIG. 2A, a distance (which is annotated as "offset") and an angle (which is annotated as "$\theta_0$") are determined for the track 10t1.

The distance "offset" may also be referred to as the offset. The offset may be the minimum distance between the reference point $(X_0, Y_0)$ and the track 10t1. In some embodiments, the offset may range from about 0.1 (μm) to about 10.0 μm. In some embodiments, the offset may be adjusted according to the routing requirements. In some embodiments, the angle $\theta_0$ may be an acute angle, which is smaller than 90 degrees, such as 45 degrees.

Then, a distance for setting the second track may be determined. In FIG. 2A, a distance (which is annotated as "pitch") is determined for the track 10t2.

The distance "pitch" may also be referred to as the pitch. The pitch may be the minimum distance between the track 10t2 and the track 10a. In some embodiments, the pitch may be different from the offset. In some embodiments, the pitch may be the same as the offset.

In some embodiments, the track 10t2 and the track 10t1 are parallel to each other. In some embodiments, the other tracks are equally spaced. In some embodiments, the pitch may be the minimum distance between the other adjacent tracks (such as the tracks 10t3 and 10t4).

In some embodiments, each of the tracks may intersect with two adjacent sides of the substrate 10. For example, the track 10t2 intersects with the sides 10b1 and 10b2 of the substrate 10.

In some embodiments, one of the tracks may be a diagonal line of the wiring area. For example, in some embodiments, the track 10t3 may connected to the left upper corner defined by sides 10b1 and 10b4 and the right lower corner defined by sides 10b2 and 10b3.

In some embodiments, one or more of the tracks may run through circuit regions which are predetermined to receive or bond to electronic components. For example, in some embodiments, the track 10t4 may run through the circuit regions 10a and 10b, which are predetermined to receive or bond to the electronic components 14a and 14b as shown in FIG. 1.

In some embodiments, the order of the operations described above may be adjusted according to design requirements and/or manufacturing conditions. For example, the offset and the pitch can be determined in the same step. For example, the pitch can be determined before the offset.

After setting the tracks, conductive traces may be disposed on one or more of the tracks, and electronic components may be disposed on the predetermined circuit regions. The final structure through the track creation operations described with respect to FIG. 2A may be similar to the substrate 10 in FIG. 1.

Referring to FIG. 2B, the track creation operations for the substrate 10 in FIG. 2B may be similar to the track creation operations for the substrate 10 in FIG. 2A, and the differences therebetween are described below.

After defining the wiring area, the reference point $(X_0, Y_0)$ in FIG. 2B is defined at the right upper corner between the sides 10b3 and 10b4 of the substrate 10.

Then, a distance and an angle for setting the first track may be determined. The first track 10t1 in FIG. 2B is adjacent to the right upper corner. The first track 10t1 intersects with the sides 10b3 and 10b4 of the substrate 10.

The final structure through the track creation operations described with respect to FIG. 2B may be similar to the substrate 10 in FIG. 1.

Figure 2C:
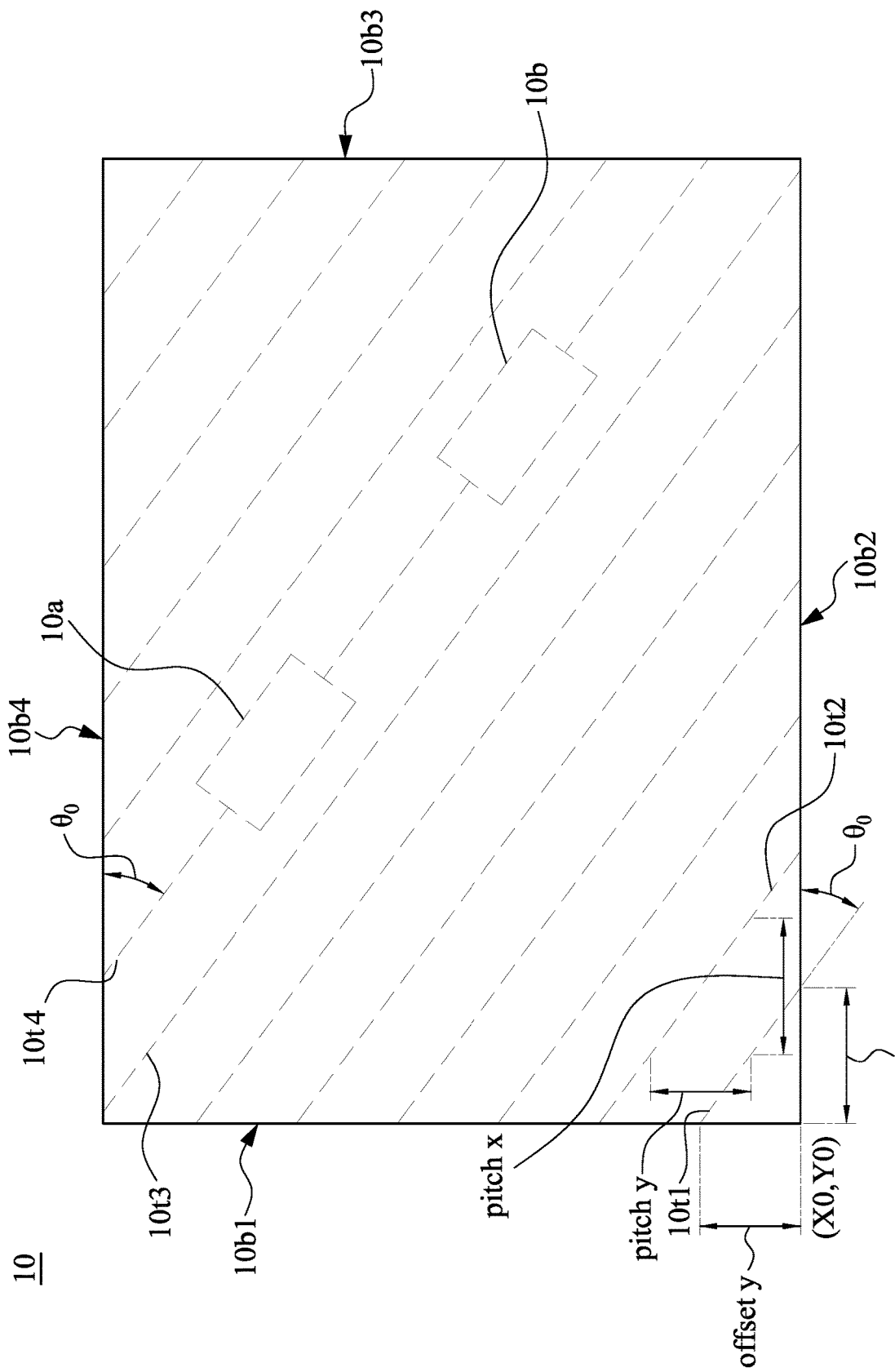

Referring to FIG. 2C, the track creation operations for the substrate 10 in FIG. 2C may be similar to the track creation operations for the substrate 10 in FIG. 2A, and the differences therebetween are described below.

After defining the wiring area, the reference point ($X_0$, $Y_0$) is defined at the left lower corner between the sides 10b1 and 10b2 of the substrate 10.

Next, distances for setting the first track may be determined. In FIG. 2C, distances (which are annotated as "offset_x" and "offset_y") are determined for the track 10t1.

The distance "offset_x" and the distance "offset_y" may also be referred to as the offset_x and the offset_y.

The offset_x may be the minimum distance between the reference point ($X_0$, $Y_0$) and the intersection of the track 10t1 and the side 10b2. The offset_y may be the minimum distance between the reference point ($X_0$, $Y_0$) and the intersection of the track 10t1 and the side 10b1. In some embodiments, the offset_x and the offset_y may be perpendicular to each other.

Then, distances for setting the second track may be determined. In FIG. 2C, distances (which are annotated as "pitch_x" and "pitch_y") are determined for the track 10t2.

The distance "pitch_x" and the distance "pitch_y" may also be referred to as the pitch_x and the pitch_y.

In some embodiments, the pitch_x may be the minimum distance between the 10t1 and the track 10t2 in the direction parallel to the side 10b2. In some embodiments, the pitch_y may be the minimum distance between the 10t1 and the track 10t2 in the direction parallel to the side 10b1. In some embodiments, the pitch_x and the pitch_y may be perpendicular to each other.

In some embodiments, the track 10t2 and the track 10t1 are parallel to each other. In some embodiments, the other tracks are equally spaced.

In some embodiments, each of the tracks may intersect with two adjacent sides of the substrate 10. For example, the track 10t2 intersects with the sides 10b1 and 10b2 of the substrate 10.

In some embodiments, the track 10t3 may be connected to the left upper corner defined by sides 10b1 and 10b4 and the right lower corner defined by sides 10b2 and 10b3.

In some embodiments, the track 10t4 may run through the circuit regions 10a and 10b, which are predetermined to receive or bond to electronic components.

In some embodiments, the order of the operations described above may be adjusted according to design requirements and/or manufacturing conditions. For example, the offset (the offset_x and the offset_y) and the pitch (the pitch_x and the pitch_y) can be determined in the same step. For example, the pitch can be determined before the offset.

After setting the tracks, conductive traces may be disposed on one or more of the tracks, and electronic components may be disposed on the circuit regions. The final structure through the track creation operations described with respect to FIG. 2C may be similar to the substrate 10 in FIG. 1.

In some embodiments, the first track may be set by determining an angle (such as the angle $\theta_0$ in FIG. 2A) and an intersection with a side (such as the offset_x or the offset_y in FIG. 2C).

Figure 2D:
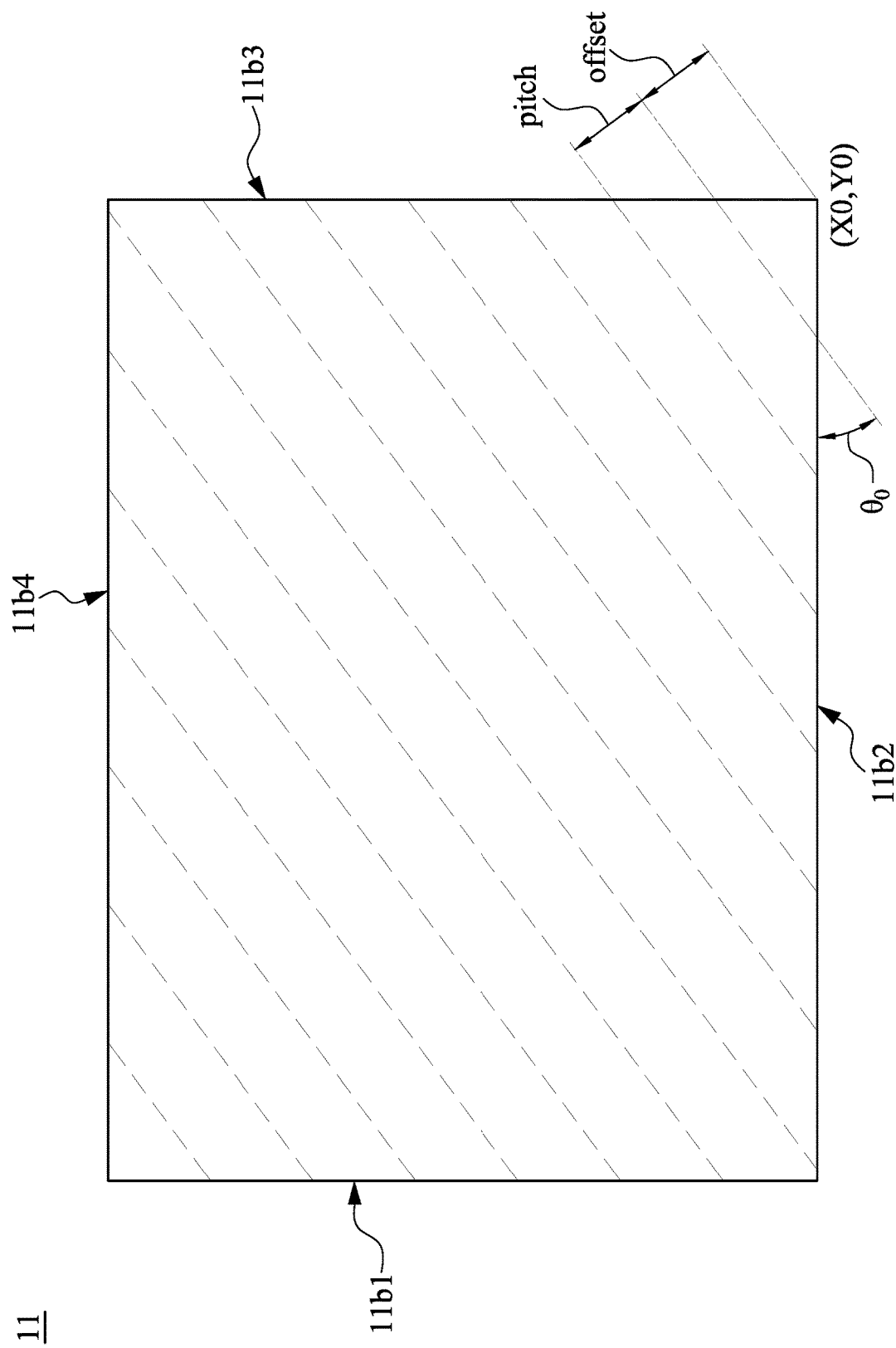
Figure 2E:
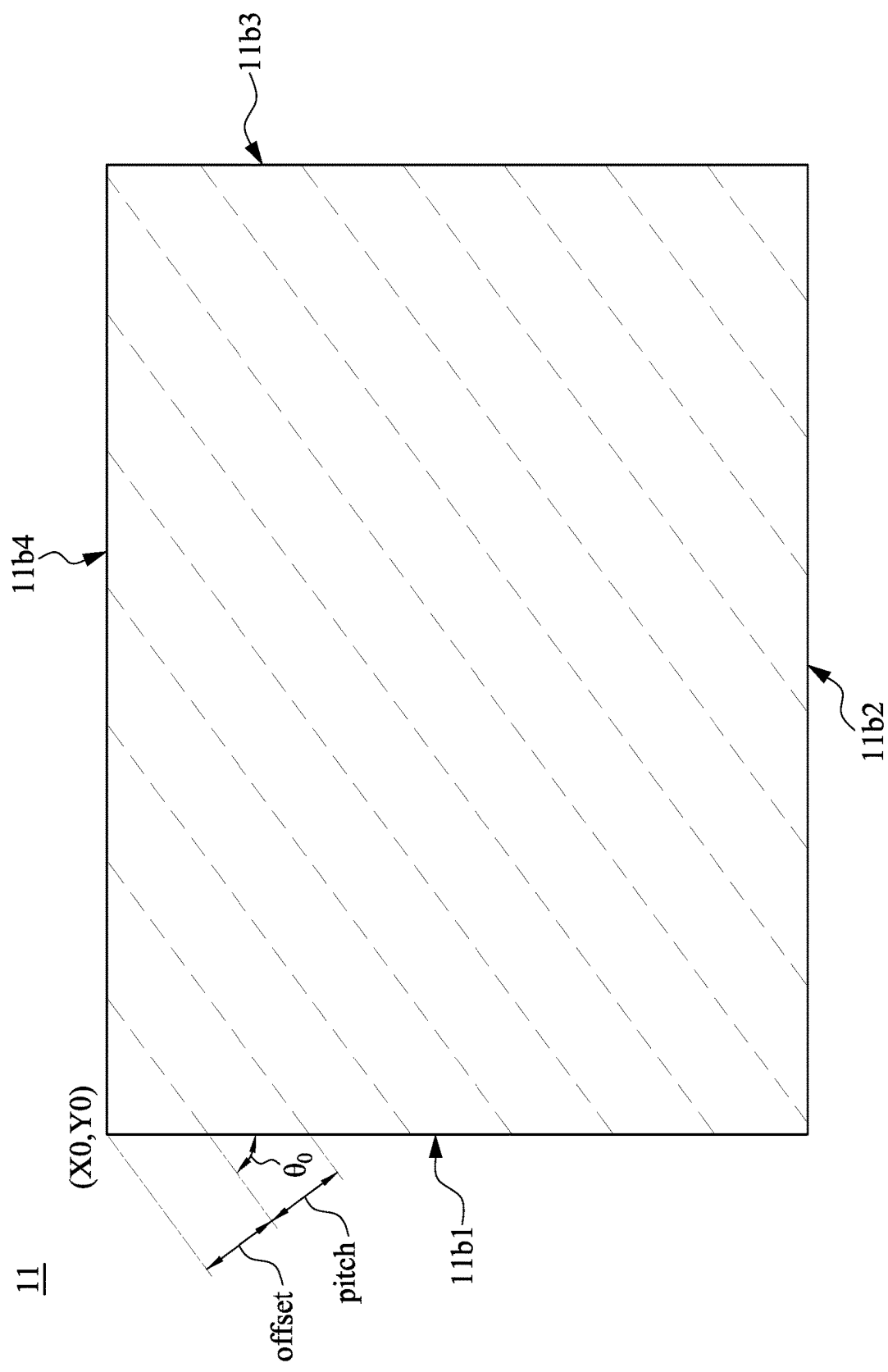

Referring to FIG. 2D and FIG. 2E, the track creation operations described with respect to FIG. 2D and FIG. 2E may be similar to the track creation operations described with respect to FIG. 2A, and the differences therebetween are described below.

Since the tracks are set to be inclined in a direction from the right upper corner to the left lower corner, the reference point is defined at the right lower corner as illustrated in FIG. 2D. In some embodiments, the reference point may be defined at the left upper corner as illustrated in FIG. 2E.

After setting the tracks, conductive traces may be disposed on one or more of the tracks. The final structure through the track creation operations described with respect to FIG. 2D and FIG. 2E may be similar to the substrate 11 in FIG. 1.

Figure 3:
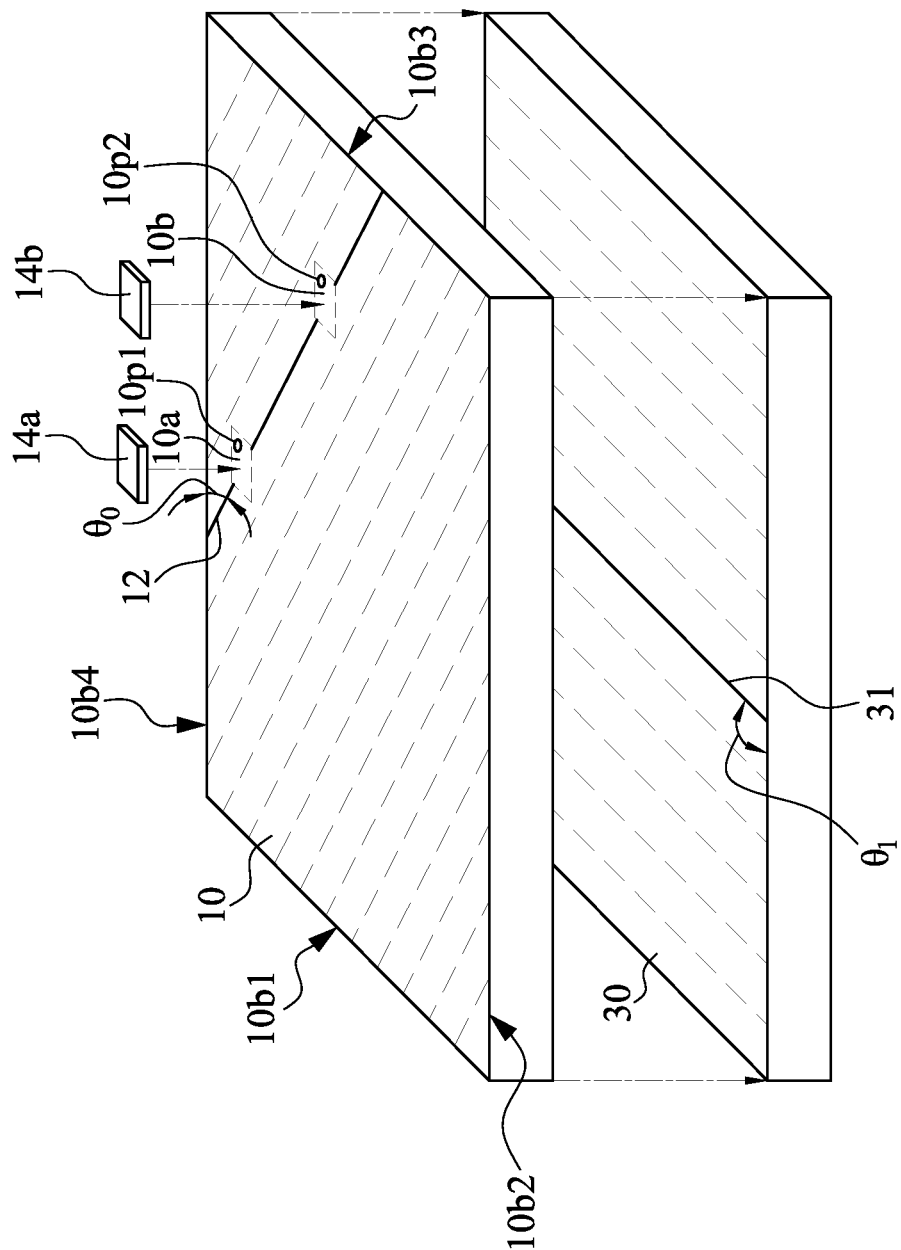
FIG. 3 illustrates an exploded perspective, view of a routing structure in accordance with some embodiments of the present disclosure.

FIG. 3 illustrates an exploded perspective view of a routing structure 3 in accordance with some embodiments of the present disclosure. The routing structure 3 in FIG. 3 is similar to the routing structure 1 in FIG. 1, and the differences therebetween are described below.

The routing structure 3 includes a substrate 30. Several tracks depicted in dotted lines are defined on a surface of the substrate 30. In some embodiments, the tracks are parallel (or perpendicular) to the boundary of the substrate 30. For example, the conductive trace 31 and the boundary of the substrate 30 may define a right angle (annotated as "$\theta_1$").

The conductive trace 31 and the conductive trace 12 are disposed on different substrate layers in the routing structure 3. The conductive trace 12 is inclined with respect to the boundary 10b of the substrate 10. The conductive trace 31 is parallel (or perpendicular) to the boundary of the substrate 30.

FIG. 4 illustrates an exploded perspective view of a routing structure 4 in accordance with some embodiments of the present disclosure. The routing structure 4 in FIG. 4 is similar to the routing structure 1 in FIG. 1, and the differences therebetween are described below.

The routing structure 4 includes a substrate 40. The wiring areas 41a, 42a, and 43a are defined inside of the outmost boundary of the substrate 40. In other words, each of the wiring areas 41a, 42a, and 43a is smaller than the active surface of the substrate 40.

The wiring area 41a encompasses the side 40b3 and the side 40b4 of the substrate 40. A corner of the wiring area 41a is overlapped with the corner defined by the side 40b3 and the side 40b4 of the substrate 40. The wiring area 42a encompasses the side 40b4 of the substrate 40. The wiring area 43a encompasses the side 40b1 and the side 40b4 of the substrate 40. A corner of the wiring area 43a is overlapped with the corner defined by the side 40b1 and the side 40b1 of the substrate 40.

The numbers and the locations of the wiring areas in the substrate 40 may be adjusted according to the design requirements. For example, there may be any numbers of wiring areas defined on the same layer of the substrate 40. For example, the wiring areas (such as the wiring areas 41a, 42a, and 43a) may be arranged at any location on the substrate 40.

In some embodiments, each of the wiring areas 41a, 42a, and 43a defined by imaginary dash-dot lines may possess a different wiring layout from the other ones. For example, conductive traces on the same layer of the substrate 40 may have different sloping directions (or angles, or positions with respect to the boundary of the substrate 40.

For example, the conductive trace 41 in the wiring area 41a is not parallel to the conductive trace 42 in the wiring area 42a. For example, the conductive trace 41 in the wiring area 41a is not parallel to the conductive trace 43 in the wiring area 43a.

For example, the conductive trace 42 in the wiring area 42a is parallel to the side 40b1 and the side 40b3 of the substrate 40. The conductive trace 42 in the wiring area 42a is non-parallel to the conductive trace 41 and the conductive trace 43.

For example, a prolongation of the conductive trace 41 define an acute angle $\theta_2$ with the side 40b4 of the substrate

40. The conductive trace 43 and the side 40b4 of the substrate 40 define an acute angle $\theta_3$ different from the acute angle $\theta_2$.

For example, a prolongation of the conductive trace 41 intersects with the side 403 and the side 404 of the substrate 40. The conductive trace 43 intersects with the side 40b1 and the side 40b3 of the substrate 40.

In some embodiments, each of the wiring areas 41a, 42a, and 43a may have their own circuit regions (not shown in FIG. 4) configured to receive or bond to electronic components.

Similarly, more than one wiring areas may be defined on the other substrate layer (such as the substrate 11 in FIG. 1).

Figure 5:
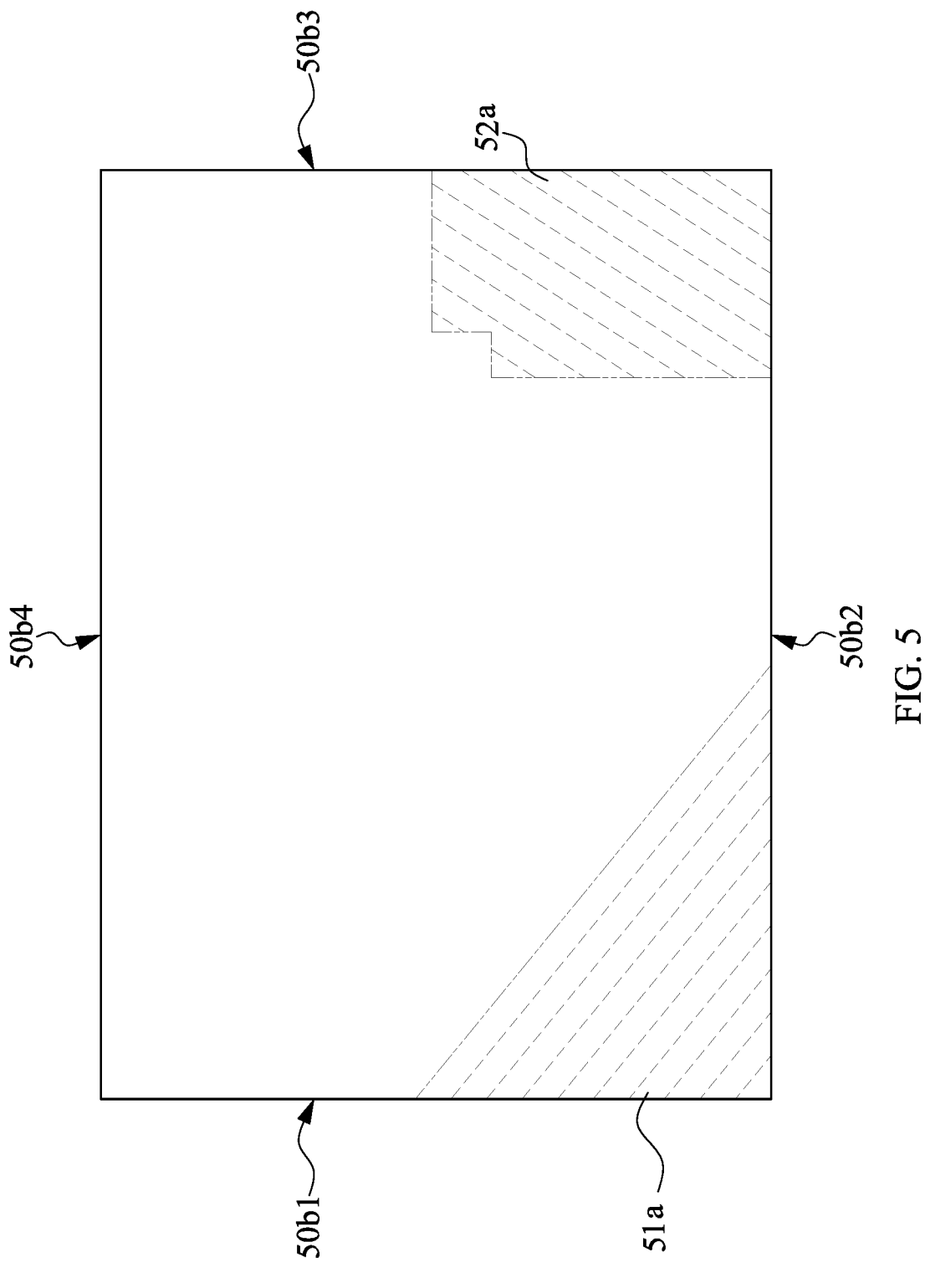
FIG. 5 illustrates a top view of a part of a routing structure in accordance with some embodiments of the present disclosure.

FIG. 5 illustrates a top view of a substrate 50 of a routing structure in accordance with some embodiments of the present disclosure. The part of the substrate 50 in FIG. 5 is similar to the substrate 10 illustrated in FIG. 1, and the differences therebetween are described below.

The substrate 50 includes sides 50b1, 50b2, 50b3, and 50b4. Wiring areas 51a and 52a are defined on the substrate 50.

The wiring area 51a is surrounded by the sides 50b1, 50b2, 50b3, and 50b4.

Two sides of the wiring area 51a encompass the side 50b1 and the side 50b2 of the substrate 50. Another side of the wiring area 51a intersects with the side 50b1 and the side 50b2 of the substrate 50. From a top view, the wiring area 51a may be a right triangle.

The wiring area 52a may have a missing corner. Two sides of the wiring area 52a encompasses the side 50b2 and the side 50b3 of the substrate 50. A corner of the wiring area 52a overlaps with the corner defined by the side 50b2 and the side 50b3 of the substrate 50.

In some embodiments, the shape of the wiring area may be defined according to design requirements, and is not limited in the specific examples illustrated in the figures. For example, the wiring area may be a triangle, a square, a pentagon, a circle, an oval, or any shape.

Some embodiments of the present disclosure provide a routing structure. The routing structure includes a substrate having a first circuit region and a boundary surrounding the first circuit region. The routing structure also includes a first conductive trace coupled to a first conductive pad disposed in the first circuit region. The first conductive trace is inclined with respect to the boundary of the substrate.

Some embodiments of the present disclosure provide a method of forming a routing structure. The method includes providing a substrate having a boundary and setting a first track for forming a conductive trace on the substrate. The first track is inclined with respect to the boundary of the substrate.

Some embodiments of the present disclosure provide a method of forming a routing structure. The method includes providing a substrate having a boundary and determining a reference point for setting a first track of a conductive trace on the substrate. The reference point is defined at a corner between two adjacent sides of the boundary of the substrate.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A routing structure, comprising:
   a substrate having a first circuit region and a boundary surrounding the first circuit region; and
   a first conductive trace coupled to a first conductive pad disposed in the first circuit region;
   wherein the first conductive trace is inclined with respect to the boundary of the substrate.

2. The routing structure of claim 1, further comprising:
   a second circuit region spaced apart from the first circuit region and surrounded by the boundary of the substrate, wherein the first conductive trace is coupled to a second conductive pad disposed in the second circuit region.

3. The routing structure of claim 1, further comprising:
   an electronic component disposed in the first circuit region and electrically connected to the first conductive pad.

4. The routing structure of claim 1, further comprising:
   a second conductive trace substantially parallel to the first conductive trace, wherein the second conductive trace is connected to a corner defined by two adjacent sides of the boundary of the substrate.

5. The routing structure of claim 1, further comprising:
   a third conductive trace on the substrate, wherein the third conductive trace is inclined with respect to the boundary of the substrate, and the third conductive trace is nonparallel to the first conductive trace.

6. The routing structure of claim 5, wherein the first conductive trace and the third conductive trace are disposed on the same layer of the substrate.

7. The routing structure of claim 5, wherein the first conductive trace and the third conductive trace are disposed on different layers of the substrate.

8. The routing structure of claim 1, further comprising:
   a fourth conductive trace on the substrate, wherein the fourth conductive trace is substantially parallel to the boundary of the substrate.

9. A method of forming a routing structure, comprising:
   providing a substrate having a boundary; and
   setting a first track for forming a conductive trace on the substrate, wherein the first track is inclined with respect to the boundary of the substrate.

10. The method of claim 9, further comprising:
    selecting a corner between two adjacent sides of the boundary of the substrate as a reference point.

11. The method of claim 10, further comprising:
    determining a first distance between the reference point and the first track; and
    setting a second track by using the first distance as the minimum distance between the first track and the second track.

12. The method of claim 11, wherein the second track intersects with the two adjacent sides of the boundary of the substrate.

13. The method of claim 10, further comprising:
determining a second distance between the reference point and an intersection of the first track and the boundary of the substrate; and
setting a third track based on the second distance.

14. The method of claim 13, wherein the third track intersects with the two adjacent sides of the boundary of the substrate.

15. The method of claim 10, further comprising:
setting a fourth track for forming a conductive trace on the substrate, wherein the fourth track is nonparallel to the first track.

16. The method of claim 10, further comprising:
setting a fifth track for forming a conductive trace on the substrate, wherein the fifth track is substantially parallel to the boundary of the substrate.

17. A method of forming a routing structure, comprising:
providing a substrate having a boundary; and
selecting a corner between two adjacent sides of the boundary of the substrate as a reference point for setting a first track of a conductive trace on the substrate.

18. The method of claim 17, further comprising:
determining a first distance between the reference point and the first track; and
setting a second track by using the first distance as the minimum distance between the first track and the second track.

19. A routing structure, comprising:
a substrate having a circuit region and a boundary surrounding the circuit region; and
a conductive trace coupled to a conductive pad disposed in the circuit region;
wherein the conductive trace and the boundary of the substrate define an acute angle.

20. A method of forming a routing structure, comprising:
providing a substrate having a boundary; and
setting a track for forming a conductive trace on the substrate, wherein the track and the boundary of the substrate define an acute angle.

* * * * *